(12) United States Patent
Lai et al.

(10) Patent No.: US 10,409,120 B2
(45) Date of Patent: Sep. 10, 2019

(54) DISPLAY PANEL AND DISPLAY DEVICE

(71) Applicant: Xiamen Tianma Micro-Electronics Co., Ltd., Xiamen (CN)

(72) Inventors: Guochang Lai, Xiamen (CN); Hongbo Zhou, Xiamen (CN); Huangyao Wu, Xiamen (CN); Zhongjie Zhang, Wuhan (CN); Qiongqin Mao, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 16/139,215

(22) Filed: Sep. 24, 2018

(65) Prior Publication Data

US 2019/0041681 A1     Feb. 7, 2019

Related U.S. Application Data

(63) Continuation-in-part of application No. 15/823,133, filed on Nov. 27, 2017, now Pat. No. 10,115,664.

(30) Foreign Application Priority Data

Aug. 1, 2017 (CN) .......................... 2017 1 0647291

(51) Int. Cl.
| | |
|---|---|
| *G02F 1/1345* | (2006.01) |
| *H01L 23/498* | (2006.01) |
| *G02F 1/1335* | (2006.01) |
| *G02F 1/1362* | (2006.01) |
| *H01L 23/538* | (2006.01) |

(Continued)

(52) U.S. Cl.
CPC .... *G02F 1/13452* (2013.01); *G02F 1/133528* (2013.01); *G02F 1/136204* (2013.01); *G02F 1/136286* (2013.01); *H01L 23/4985* (2013.01); *H01L 23/49572* (2013.01); *H01L 23/49855* (2013.01); *H01L 23/5387* (2013.01); *H01L 23/5388* (2013.01); *G02F 1/13458* (2013.01); *G02F 2202/16* (2013.01); *G02F 2202/22* (2013.01); *G02F 2202/28* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 7,102,718 B1 * | 9/2006 | Yamazaki | ......... G02F 1/134363 257/E27.111 |
| 2001/0012084 A1 | 8/2001 | Ohta et al. | |
| 2008/0169750 A1 | 7/2008 | Kim et al. | |

(Continued)

FOREIGN PATENT DOCUMENTS

JP     2014206604 A     10/2014

*Primary Examiner* — Minh Loan Tran
(74) *Attorney, Agent, or Firm* — Anova Law Group, PLLC

(57) ABSTRACT

A display panel and a display device are provided. The display panel includes a first substrate having a step area; a second substrate disposed opposite to the first substrate, wherein the second substrate has a first surface facing the first substrate and an opposite second surface; a Chip On Flex (COF) disposed on the step area of the first substrate and including at least one ground pad; a conductive layer disposed on the second surface of the second substrate; and a conductive adhesive electrically connected to the conductive layer and the at least one ground pad.

17 Claims, 10 Drawing Sheets

(51) Int. Cl.
*H01L 23/495* (2006.01)
*H01L 27/32* (2006.01)

(56) References Cited

U.S. PATENT DOCUMENTS

2016/0282990 A1* 9/2016 Kimura ............... G02F 1/13338
2018/0113333 A1 4/2018 Zhu et al.

* cited by examiner

US 10,409,120 B2

DISPLAY PANEL AND DISPLAY DEVICE

CROSS-REFERENCES TO RELATED APPLICATIONS

This application is a continuation in part of U.S. patent application Ser. No. 15/823,133, filed on Nov. 27, 2017, which claims the priority of Chinese Patent Application No. 201710647291.7, filed on Aug. 1, 2017, the entire contents of all of which are incorporated herein by reference.

FIELD OF THE DISCLOSURE

The present disclosure generally relates to the display technology and, more particularly, relates to a display panel and a display device.

BACKGROUND

Liquid crystal displays (LCDs) are featured with various advantages, such as low radiation, compactness and low energy consumption, which have gradually replaced traditional cathode ray tube (CRT) displays and have been widely used in flat-panel TVs, laptops, and other portable products.

An existing LCD panel often includes an array substrate, a color film substrate, and a liquid crystal layer disposed between the array substrate and the color film substrate. Because static electricity is often generated on the color film substrate when the display panel is in operation, an antistatic film is desired to be disposed on the color film substrate. The antistatic film is electrically connected to a ground pad disposed on the array substrate, thereby discharging the static electricity generated on the color film substrate.

However, as the display technology advances, the resolution of the display panel is getting higher and higher, more wires (such as data wires for transmitting data signals) are going to be disposed in the frame/border area (especially the lower frame area) of the display panel, and the ground pad also occupies a part of the lower frame area, which in turn enlarges the lower frame area (also called a step area) and is not favorable for narrowing the frame of the display panel.

The disclosed display panel and display device are directed to solve one or more problems set forth above and other problems.

BRIEF SUMMARY OF THE DISCLOSURE

One aspect of the present disclosure provides a display panel. The display panel includes a first substrate having a step area, and a second substrate disposed opposite to the first substrate. The second substrate has a first surface facing the first substrate and an opposite second surface. A Chip On Flex (COF) is disposed on the step area of the first substrate and includes at least one ground pad. The COF has a first surface facing the first substrate, a second surface opposing the first surface, and a first side intersecting with the first surface and the second surface, respectively. The at least one ground pad includes a first component disposed on the first side of the COF. A conductive layer is disposed on the second surface of the second substrate, and a conductive adhesive is electrically connected to the conductive layer and at least the first component of the at least one ground pad.

Another aspect of the present disclosure provides a display device including a display panel. The display panel includes a first substrate having a step area, and a second substrate disposed opposite to the first substrate. The second substrate has a first surface facing the first substrate and an opposite second surface. A Chip On Flex (COF) is disposed on the step area of the first substrate and includes at least one ground pad. The COF has a first surface facing the first substrate, a second surface opposing the first surface, and a first side intersecting with the first surface and the second surface, respectively. The at least one ground pad includes a first component disposed on the first side of the COF. A conductive layer is disposed on the second surface of the second substrate, and a conductive adhesive is electrically connected to the conductive layer and at least the first component of the at least one ground pad.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
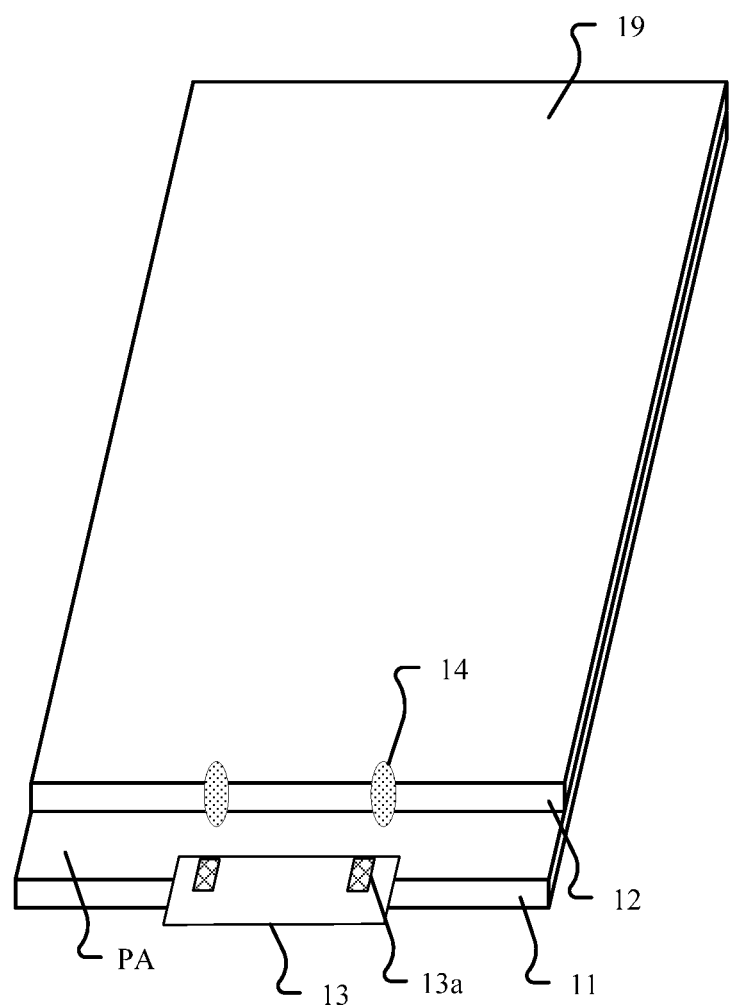
FIG. 1 illustrates a schematic view of an exemplary display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improved display panel. The display panel may comprise a first substrate having a step area; a second substrate disposed opposite to the first substrate, wherein the second substrate has a first surface facing the first substrate and an opposite second surface; a COF (Chip On Flex or Chip On Film) disposed on the step area of the first substrate and comprising at least one ground pad, wherein the COF has a first surface facing the first substrate and an opposite second surface, and the at least one ground pad is disposed on the second surface of the COF; a conductive layer disposed on the second surface of the second substrate; and a conductive adhesive electrically connected to the conductive layer and at least one the ground pad.

Through disposing the ground pad on the second surface of the COF (i.e., the surface of the COF far away from the first substrate), the generated static electricity may be released and, meanwhile, the area occupied by the step area of the first substrate may be reduced, which may narrow the frame/border of the display panel.

FIG. 1 illustrates a schematic view of an exemplary display panel consistent with disclosed embodiments. As shown in FIG. 1, the display panel may include a conductive adhesive 14, a COF (Chip On Flex or Chip On Film) 13, a conductive layer 19, a first substrate 11, and a second substrate 12 disposed opposite to the first substrate 11. The COF 13 may be bonded to a step area PA of the first substrate 11. The second substrate 12 may have a first surface facing the first substrate 11 and an opposite second surface away from the first substrate 11. The conductive layer 19 may be disposed on the second surface of the second substrate 12. The step area PA may refer to an area of the first substrate 11 which is not covered by the second substrate 12.

The COF 13 may comprise at least one ground pad 13a. The COF 13 may have a first surface facing the first substrate 11 and an opposite second surface away from the first substrate 11. The ground pad 13a may be disposed on the second surface of the COF 13 (for example, the upper surface of the COF 13 in FIG. 1). That is, the arrangement of the ground pad 13a may not affect the electrical connection between the first surface of the COF 13 (the surface facing the first substrate 11) and the first substrate 11.

The conductive adhesive 14 may be electrically connected to the conductive layer 19. In one embodiment, the conductive adhesive 14 may be disposed at a junction of the first substrate 11 and the second substrate 12 and, meanwhile, the conductive adhesive 14 may cover a portion of the conductive layer 19. The conductive adhesive 14 may also be electrically connected to the ground pad 13a, for example, by wires (not drawn in FIG. 1) on the first substrate 11. Thus, the electrical connection between the conductive layer 19 and the ground pad 13a may be generated.

When static electricity is generated on the second surface of the second substrate 12 (i.e., the surface of the second substrate 12 away from the first substrate 11, for example, an upper surface of the second substrate 12 in FIG. 1), for example, when static electricity is generated during the user operation of the display panel, the generated static electricity may be transferred to the ground pad 13a via the conductive layer 19 and the conductive adhesive 14, then released. Thus, the static electricity may be prevented from being accumulated on the upper surface of the second substrate 12, and prevented from being discharged inside the display panel to cause a failure of the display panel.

Meanwhile, because the ground pad 13a is disposed on the second surface of the COF 13 (i.e., the surface of the COF far away from the first substrate 11), the ground pad 13a may not occupy the step area PA of the first substrate 11, which may reduce the area occupied by the step area PA, increase the proportion of the display area in the display panel, and further narrow the frame of the display panel.

In the disclosed embodiments, COF (Chip On Flex or Chip On Film) refers to a package in which an integrated circuit (IC), such as a driving integrated circuit, is directly encapsulated on a flexible circuit board (e.g., a flexible printed circuit). In addition to COF, the integrated circuit package in existing technologies also includes Tape Automated Bonding (TAB), and Chip On Glass (COG), etc.

In particular, TAB refers to a package in which welds of the integrated circuits and the bumps on the tape are automatically bonded together, which is featured with mature technology and high yield. However, only the integrated circuits are allowed to be disposed on the tape, the line spacing is usually greater than 40 µm, such as 75 µm, which may not be applicable to products of high-resolution (1280*960 or higher). In contrast, COF can provide a smaller line spacing such as 25 µm, and more circuit elements (such as resistors, capacitors) may be allowed to be disposed on the flexible substrate, such that COF may be applied to high resolution display panels in various sizes and, moreover, COF is also featured with simple fabrication process and good flexibility.

COG refers to a package in which the integrated circuits are directly pressed onto the glass substrate of the display panel. The cost is low and micro-scale line spacing may be realized, however, rework is difficult, and the packaging area occupies a substantially large area and, accordingly, the display area is substantially small. In addition, due to the expansion coefficient of the integrated circuits and glass, high temperature bonding may be likely to generate Mura resulted from warping. In contrast, COF arranges the integrated circuits on the flexible circuit board, which may enlarge the display area, facilitate the rework, and reduce the maintenance cost and defective risk of the display panels.

In the existing COF, in addition to the integrated circuits, other components are seldom disposed on the COF and, thus, the utilization of the flexible substrate is relatively low. In the disclosed embodiments, through disposing the ground pad 13a on the COF, the static electricity may be prevented from being accumulated and, meanwhile, the utilization of the COF flexible substrate may be improved. Through disposing the ground pad 13a on the COF rather than the step area PA, extra wires in the step area PA may not to be introduced.

Thus, in the disclosed embodiments, through providing a COF package of the integrated circuits, and disposing the ground pad on the second surface of the COF (i.e., the surface of the COF away from the first substrate), the area occupied by the step area PA may be reduced, and the narrow frame/border of the display panel may be realized. In addition, the technical solution provided by the disclosed embodiments may be applied to display panels of various sizes, which are featured with wide applicability, easy rework, increased COF flexible substrate utilization, low maintenance cost, and low display panel defective risk.

FIG. 1 shows that the COF 13 includes two rectangular ground pads 13a, which is for illustrative purposes and is not intended to limit the scope of the present disclosure. It should be noted that, the COF 13 may include any appropriate number of ground pads 13a, such as one, three, four, and the ground pad 13a may also have any appropriate shapes, such as a circular shape, an oval shape, a trapezoidal shape. The number of the ground pads 13a and the shape of the ground pads 13a may be determined according to various application scenarios.

The display panel may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels capable of displaying videos and/or images.

The display panel may also include certain known structures. For example, when the display panel is an LCD panel, the display panel may further include thin film transistors (TFTs) disposed on the first substrate 11 (or called as an array substrate), and a liquid crystal layer sandwiched between the first substrate 11 and the second substrate 12 (or called as a color film substrate). When the display panel is an OLED display panel, the display panel may further include OLEDs disposed between the first substrate 11 and the second substrate 12 (the second substrate may be used as a cover plate). These certain known structures are not explained in detail here.

In one embodiment, as shown in FIG. 1, the conductive adhesive 14 may include a conductive silver paste or a conductive tape.

In particular, the conductive silver paste may be obtained by adding conductive particles (for example, silver powder) into a base resin, and the electrical conductivity of the conductive silver paste may be improved by increasing the content of the conductive particles (for example, 70% silver powder or more). When the conductive adhesive 14 includes the conductive silver paste, the conductive silver paste may be dripped on the display panel and cured under high temperature to be bonded to the second substrate, there realizing a stable electrical connection.

The conductive tape may be a metal foil or conductive fabric having a high conductive back adhesive. The conductive tape may be formed by a conductive back adhesive and a conductive substrate, and may be electrically connected to the conductor surface through an adhesive bonding. When the conductive adhesive 14 includes a conductive tape, the conductive adhesive 14 may be directly attached to the conductor layer 19 and the ground pad 13a, which is featured with simple process and high success rate.

FIG. 1 shows that the conductive adhesive 14 is directly electrically connected to the conductive layer 19 but indirectly electrically connected the ground pad 13a, which is for illustrative purposes and is not intended to limit the scope of the present disclosure.

In another embodiment, the conductive adhesive 14 may be directly electrically connected to both the conductive layer 19 and the ground pad 13a. A corresponding structure is shown in FIGS. 2A-2B.

Figure 2A:
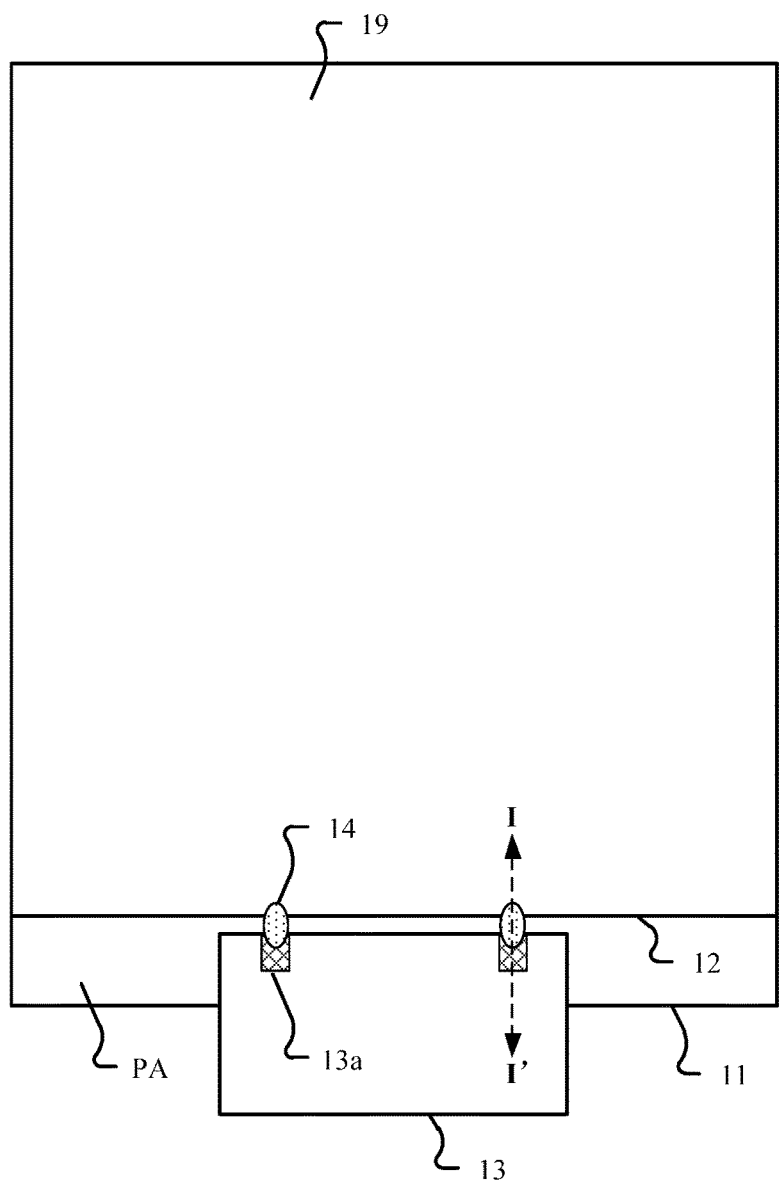
FIG. 2A illustrates a top view of an exemplary display panel consistent with disclosed embodiments.
Figure 2B:
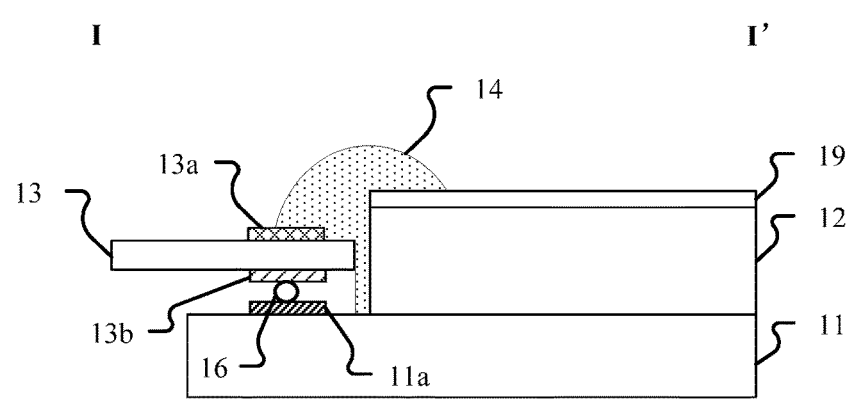
FIG. 2B illustrates an exemplary sectional view of an exemplary display panel along line I-I' in FIG. 2A consistent with disclosed embodiments.

FIG. 2A illustrates a top view of an exemplary display panel consistent with disclosed embodiments. FIG. 2B illustrates an II'-sectional view of an exemplary display panel in FIG. 2A consistent with disclosed embodiments. The similarities between FIG. 1 and FIGS. 2A-2B are not repeated here, while certain difference may be explained.

As shown in FIG. 2A, the conductive adhesive 14 may cover not only a part of the conductive layer 19, but also at least a part of the ground pad 13a. That is, the conductive layer 19 may be connected to the ground pad 13a through the conductive adhesive 14 only. Accordingly, on one hand, the electrostatic discharge path may be shortened, and the static electricity may be more efficiently released. On the other hand, connection wires may not have to be disposed on the first substrate 11, simplifying the wiring design of the step area PA and narrowing the frame of the display panel.

FIG. 2A shows that the conductive adhesive 14 covers only a part of the ground pad 13a, which is for illustrative purposes and is not intended to limit the scope of the present disclosure. In another embodiment, the conductive adhesive 14 may completely cover the entire ground pad 13a, as long as the conductive adhesive 14 is directly electrically connected to the ground pad 13a.

In one embodiment, as shown in FIGS. 2A-2B, the orthogonal projection of the ground pad 13a onto the first substrate 11 may be located within the step area PA of the first substrate 11.

In particular, the ground pad 13a may be electrically connected to the conductive adhesive 14 at the step area PA. Because the COF 13 is flexible, to prevent the electrical connection between the conductive adhesive 14 and the ground pad 13a from being affected by the bending of the COF 13 (for example, electrical connection failure, in particularly when the conductive adhesive 14 is cured under high temperature), the ground pad 13a may also be disposed in the step area PA. The spatial position of the ground pad 13a may be fixed, thereby enhancing the stability of the electrical connection between the ground pad 13a and the conductive adhesive 14.

In one embodiment, a plurality of first terminals 13b may be disposed on the surface of the COF 13 facing the first substrate 11, and a plurality of second terminals 11a may be disposed on the surface of the first substrate 11 facing the COF 13. For example, as shown in FIG. 2B, the plurality of first terminals 13b may one-to-one corresponding to the plurality of second terminals 11a, and the plurality of first terminals 13b may be one-to-one electrically connected to the plurality of second terminals 11a.

Accordingly, the driving signals provided by the integrated circuit (not shown) disposed on the COF 13 may be transmitted to the first substrate 11 through the first terminals 13b and the second terminals 11a, thereby driving the display panel to display images.

Figure 3A:
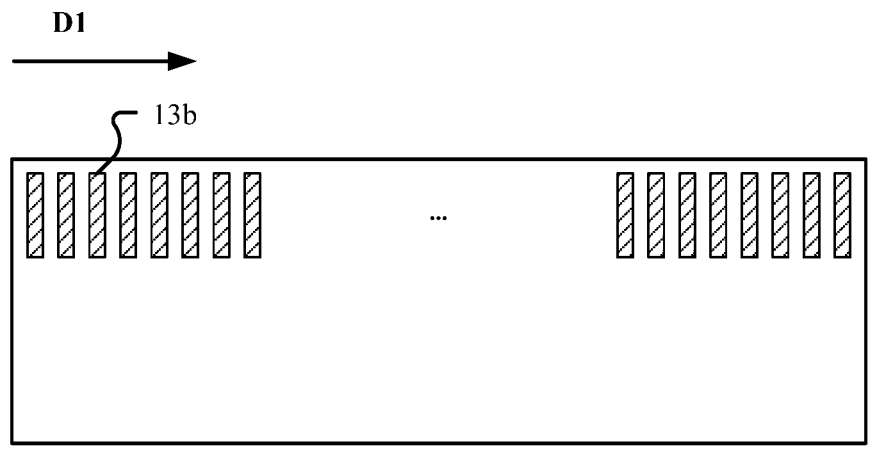
FIGS. 3A-3B illustrates schematic views of exemplary COFs (Chip On Flex or Chip On Film) consistent with disclosed embodiments.

In certain embodiments, as shown in FIGS. 2A, 2B and 3A, the plurality of first terminals 13b and the plurality of second terminals 11a may be arranged in a first direction D1, respectively. As shown in FIG. 2A, the first substrate 11 may have a first side 51 close to the COF 13 and an opposite second side S2 far away from the COF 13. Here, the first direction refers to the extending direction of the first side 51 of the first substrate 11, i.e., the side close to the COF 13.

Because the plurality of first terminals 13b are one-to-one corresponding to the plurality of second terminals 11a, only the first terminal 13b will be described as an example.

In particular, as shown in FIGS. 2A, 2B and 3A, the plurality of first terminals 13b may be disposed on the first surface of the COF 13 (i.e., the surface facing the first substrate 11) and, meanwhile, may be sequentially arranged in the first direction D1. The plurality of first terminals 13b may include various types of terminals, for example, a clock terminal for transmitting a clock signal, a data terminal for transmitting a data signal, a power supply terminal for supplying a power supply voltage, a ground terminal for a ground signal, reserved dummy terminals and other control terminals.

In general, the data wire, which is disposed on the first substrate 11 for transferring the data signal between the data line and the integrated circuits, is an important factor affecting the narrow border of the display panel and, more specifically, in a second direction perpendicular to the first direction D1, the width of the fan-out area for arranging the data wires is an important factor affecting the narrow border of the display panel. To reduce the width of the fan-out region in the second direction D2, the gap/interval of the data terminals in the first direction D1 may be desired to be as large as possible. For example, different types of first terminals 13b may be alternately arranged in the first direction D1, i.e., other types of first terminals may be disposed between adjacent data terminals.

Figure 3B:
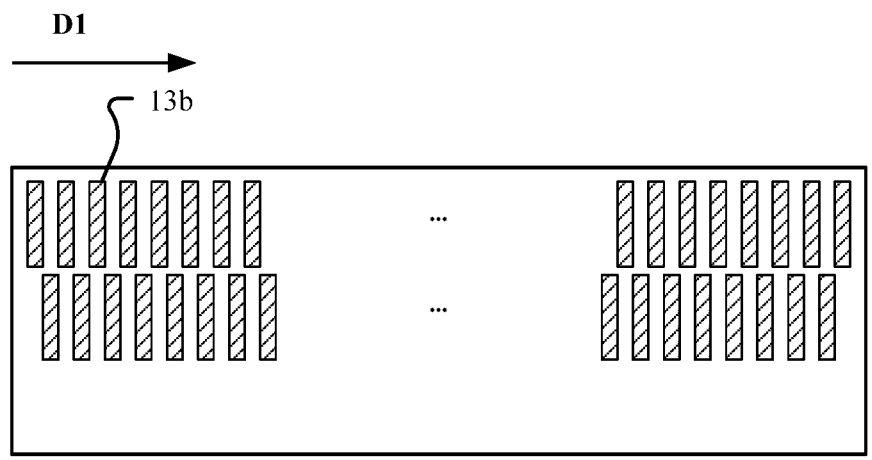

In one embodiment, as shown in FIG. 3A, the plurality of first terminals 13b may be arranged in a row in the first direction D1. In another embodiment, as shown in FIG. 3B, the plurality of first terminals 13b may be arranged in a plurality of rows in the first direction D1.

Figure 4:
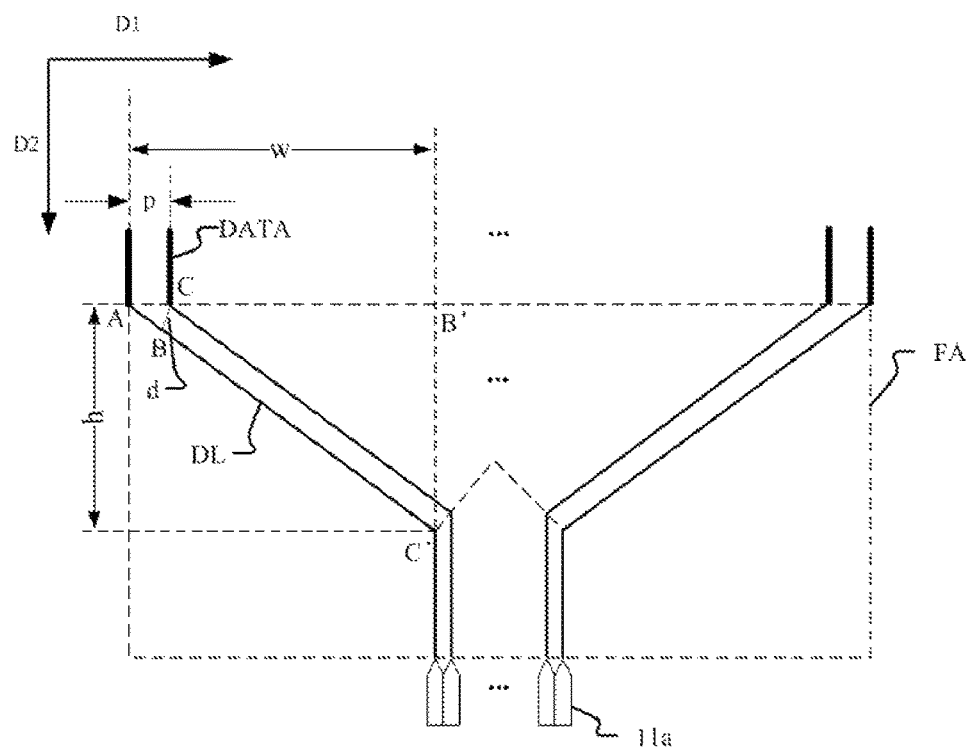
FIG. 4 illustrates a schematic view of an exemplary fan-out area consistent with disclosed embodiments.

FIG. 4 illustrates a schematic view of an exemplary fan-out area consistent with disclosed embodiments. The features of the disclosed embodiments will be described in detail with reference to FIG. 4.

As shown in FIG. 4, in addition to the plurality of second terminals 11a one-to-one electrically connected to the plurality of first terminals (first terminals are not drawn in FIG. 4), the first substrate may further comprise a plurality of data lines DATA extending from the display area. The data lines DATA may provide a data voltage to each pixel in the display area.

The plurality of second terminals 11a may be one-to-one electrically connected to plurality of data lines DATA through data wires, and each data wire may include a first portion extending in the second direction D2 and a second portion DL intersecting both the first direction D1 and the second direction D2. The width of the fan-out area FA in the second direction D2 may be mainly determined by the second portion DL of the data wire, because the length of the first portion of the data wire may be substantially small in the second direction D2 and may be neglected.

As shown in FIG. 4, the distance between the connection points of two adjacent data lines DATA and the corresponding data wires (for example, the length of the line segment AC) is p, the interval of data wires (for example, the length of the line BC) is d, the distance between the second terminal 11a and the electrically connected data line DATA in the first direction D1 (for example, the length of the line segment AB') is w, and the height of the second portion DL of the data wire in the second direction D2 (i.e., the length of the line segment B'C') is h.

The apex A is the connection point between the first data line DATA and the first data wire in the first direction D1. The apex C is the connection point between the second data line DATA and the second data wire in the first direction D1. The apex B is the intersection between the first data wire and a vertical line from the apex C to the second part DL of the first data wire, the apex C' is another end of the second part DL of the first data wire, and the apex B' is the intersection between an extending line of the apex A and the apex C and a vertical line from the apex C' to the extending line of the apex A and the apex C According to the similar triangular principle, $$\frac{BC}{AB} = \frac{B'C'}{AB'}, \qquad (1)$$

$$\text{i.e., } \frac{d}{\sqrt{p^2 - d^2}} = \frac{h}{w}, \qquad (2)$$

$$\text{then } h \text{ may be calculated as } h = w \times \frac{d}{\sqrt{p^2 - d^2}}, \qquad (3).$$

In practical applications, the interval of data wires d is limited by the process conditions and the electrical parameters, and the minimum interval of data wires $d_{min}$ may be a fixed value.

According to Eq. (3)

$$h = w \times \frac{d}{\sqrt{p^2 - d^2}},$$

when the interval of data wires d reaches the minimum value, the height h of the second portion DL of the data wire in the second direction D2 may be related to the distance p between the connection points of two adjacent data lines DATA and the corresponding data wires (for example, the length of the line segment AC), as well as, the distance w between the second terminal 11a and the electrically connected data line DATA in the first direction D1 (for example, the length of the line segment AB').

In the disclosed embodiments, the distance p between the connection points of two adjacent data lines DATA and the corresponding data wires (for example, the length of the line segment AC) may be determined by the characteristics of the display panel itself, such as resolution and size, which may be considered as a fixed value. Thus, through arranging the plurality of second terminals 11a (i.e., the plurality of first terminals 13b) in the first direction D1 and, meanwhile, alternately arranging the second terminals 11a of the same type, the distance w between the second terminal 11a and the electrically connected data line DATA in the first direction D1 (for example, the length of the line segment AB') may be reduced. Accordingly, the height h of the second portion DL of the data wire in the second direction D2 may be reduced, the area occupied by the step area PA may be reduced, thereby narrowing border of the display panel.

Figure 5A:
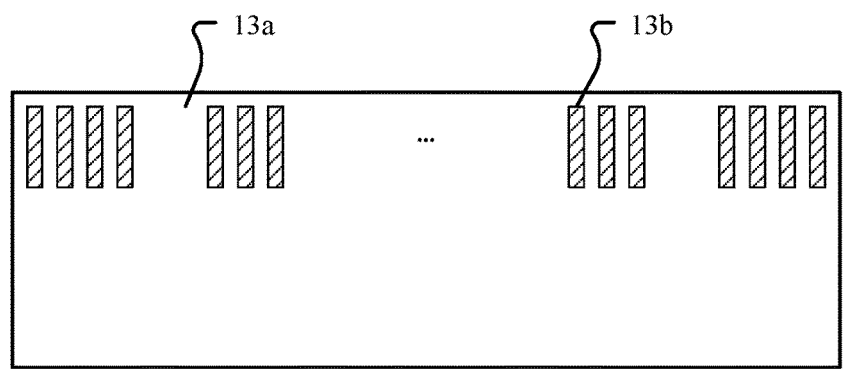
FIGS. 5A-5B illustrates schematic views of other exemplary COFs consistent with disclosed embodiments.
Figure 5B:
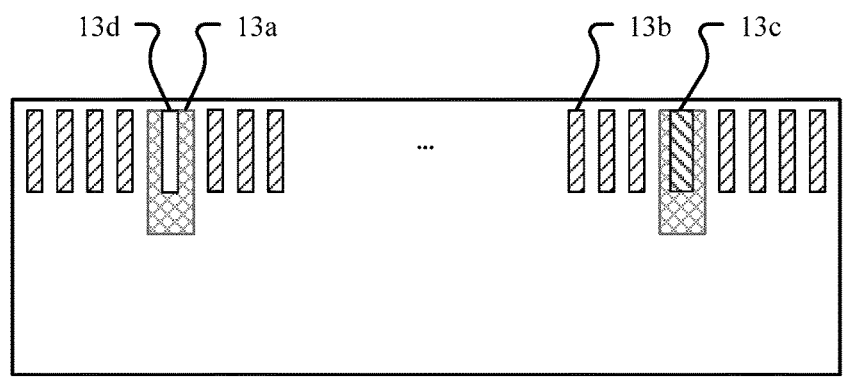

FIGS. 5A-5B illustrates schematic views of exemplary COFs consistent with disclosed embodiments.

In one embodiment, as shown in FIG. 5A, in a direction perpendicular to the first substrate 11, the ground pad 13a and the first terminals 13b may not overlap with each other. That is, when being projected to the first substrate 11, the orthogonal projection of the ground pad 13a may not overlap with the orthogonal projection of the first terminals 13b. That is, the first terminal 13b may not be provided in a region of the COF 13, in which the region overlaps with the ground pad 13a in the direction perpendicular to the first substrate 11.

In another embodiment, as shown in FIG. 5B, a ground signal or a dummy signal may be connected to a region of the COF 13, in which the region is an overlapping area of the first terminals 13b and the ground pad 13a in the direction perpendicular to the first substrate 11.

That is, some first terminals 13b may overlap with the ground pad 13a in the direction perpendicular to the first substrate 11, and the first terminal 13b overlapping with the ground pad 13a may be a ground terminal 13c for the ground signal or a reserved dummy terminal 13d (the dummy terminal 13d may be connected to a dummy signal or may not receive any signals).

FIG. 5B shows that the ground pad 13a overlaps with only one ground terminal 13c, or overlaps with only one dummy terminal 13d, which is for illustrative purposes and is not intended to limit the scope of the present disclosure. It could be understood that, the ground pad 13a may overlap with the ground terminal 13c and the dummy terminal 13d at the same time, and may overlap with any appropriate number of the ground terminals 13c and dummy terminals 13d overlapping with the ground pads 13a.

Figure 6:
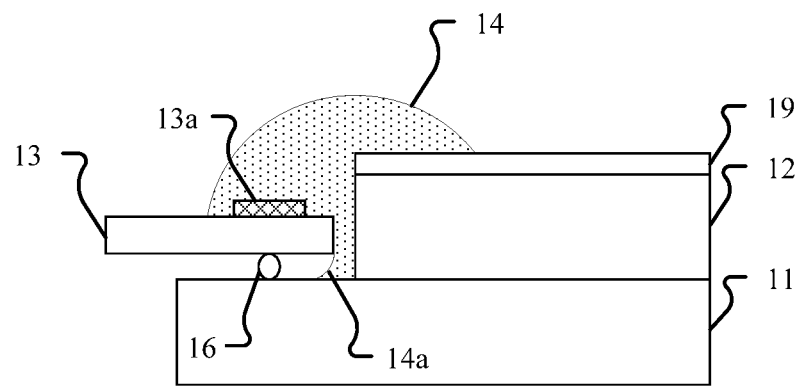
FIG. 6 illustrates a cross-sectional view of another exemplary display panel consistent with disclosed embodiments.

The features of the embodiments shown in FIGS. 5A and 5B will be described with reference to FIG. 6, and FIG. 6 illustrates a cross-sectional view of another exemplary display panel consistent with disclosed embodiments.

As shown in FIG. 6, there may be a gap formed between the COF 13 and the first substrate 11. When the conductive adhesive 14 is in a fluid state (for example, during infusion or high temperature curing), a certain portion of the conductive adhesive 14 may flow into the gap between the COF 13 and the first substrate 11, such as a portion 14a of the conductive adhesive shown in FIG. 6. Then when the first terminal is configured to overlap with the ground pad 13a in the direction perpendicular to the first substrate 11, the first terminal may become electrically connected to the ground pad 13a through the portion 14a of the conductive adhesive. That is, a short circuit may be generated between the first terminal and the ground pad 13a, which may cause a failure of the display panel.

In the COF shown in FIG. 5A, the first terminals may not be provided in an area overlapped with the ground pad in the direction perpendicular to the first substrate 11 and, thus, in an area overlapped with the ground pad in the direction perpendicular to the first substrate 11, none of the first terminals will become electrically connected to the ground pad 13a due to the penetration of the conductive adhesive 14. Accordingly, a short circuit between the first terminal and the ground pad 13a may be prevented, thereby improving the reliability of the display panel.

In the COF shown in FIG. 5B, although the first terminal is provided in in an area overlapped with the ground pad in the direction perpendicular to the first substrate 11, the first terminal may be the ground terminal 13c or the dummy terminal 13d. In particular, the ground terminal 13c itself has been provided with a same potential as the ground pad 13a, and the dummy terminal 13d may not generate electrical defects even being short-circuited with the ground pad 13a. Thus, the reliability of the display panel may be improved.

In one embodiment, as shown in FIG. 2B, the plurality of first terminals 13b and the plurality of second terminals 11a may be one-to-one electrically connected through an anisotropic conductive adhesive 16.

Because the anisotropic conductive adhesive 16 is conductive only in the direction perpendicular to the first substrate 11, but non-conductive in the direction parallel to the first substrate 11, even the interval between the adjacent first terminals 13b/second terminals 11a is small, the adjacent first terminals 13b/second terminals 11a may not be short circuited, thereby further improving the reliability of the display panel.

Figure 7A:
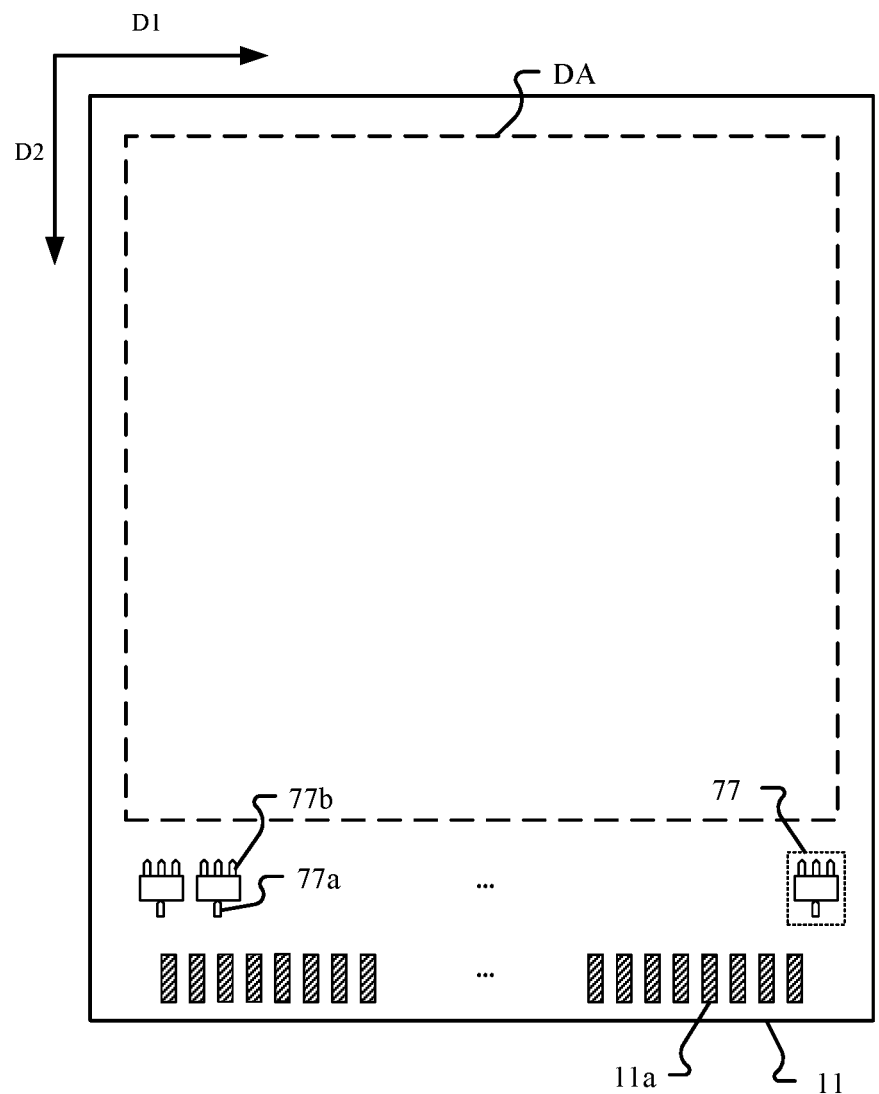
FIG. 7A illustrates a top view of another exemplary display panel consistent with disclosed embodiments.

FIG. 7A illustrates a top view of another exemplary display panel consistent with disclosed embodiments. The similarities between FIG. 1 and FIG. 7A are not repeated here, while certain difference may be explained.

As shown in FIG. 7A, the first substrate 11 may further include a plurality of multiplexing circuits 77 disposed in a non-display area, and each multiplexing circuit 77 may include at least one first signal input terminal 77a and a plurality of first signal outputs 77b. In particular, the first signal input terminal 77a may be electrically connected to the second terminal 11a (the electrical connection is not drawn in FIG. 7A), and the first signal output terminal 77b may be electrically connected to the data line (for example, the data line DATA shown in FIG. 4). The at least one first signal input terminal 77a in each multiplexing circuit 77 may be arranged in the first direction D1. In the disclosed embodiments, the non-display area may surround the display area DA.

The multiplexing circuit 77 may process the data voltage on a data output channel of the integrated circuit included in the COF in a time-division manner, and then supply the data voltage to a plurality of data lines (not shown) through the first signal output terminals 77b.

In particular, when the multiplexed circuit is not configured in the display panel, the integrated circuit is often provided with n number of data output channels (n is a positive integer greater than 1 and equal to the number of data lines). When the multiplexed circuit is configured in the display panel, for example, given the ratio of the number of the first signal input terminals 77a to the number of the first signal output terminals 77b is 1:3, the integrated circuit may only be provided with n/3 number of data output channels. That is, both the number of the first terminals and the number of the second terminals may be reduced from n to n/3 and, accordingly, the number of the data wires may be also reduced from n to n/3, thereby reducing the size of fan-out area. Moreover, through configuring a reasonable wiring, the frame/border width of the display panel may be further reduced.

In the disclosed embodiments, through disposing the multiplexing circuits on the first substrate 11, the number of data wires may be reduced, such that the data wires and the second terminals may be distributed more sparsely in the first direction D1, the interval between two adjacent first signal input terminals may be increased, the distance between the second terminal and the corresponding electrically connected first signal input terminal may be reduced in the first direction D1. Accordingly, the overall height of the data wires in the second direction D2 may be reduced, thereby narrowing the frame/border of the display panel.

FIG. 7A shows that each multiplexing circuit 77 includes one first signal input terminal 77a and three first signal output terminals 77b, which is for illustrative purposes and is not intended to limit the scope of the present disclosure. It should be noted that, each multiplexing circuit 77 may comprise any appropriate number of first signal input terminals 77a and first signal output terminals 77b. The ratio of the number of the first signal input terminals 77a to the number of the first signal output terminals 77b may be determined according to various application scenarios, as long as the number of the first signal output terminal 77b is larger than the number of the first signal input terminal 77a. For example, the ratio of the number of the first signal input terminals 77a to the number of the first signal output terminals 77b may be configured to be 1:2, 1:6 or 2:6.

In one embodiment, as shown in FIG. 7A, the plurality of first signal input terminals 77a may be arranged with the same interval, and the ratio of the number of the first signal input terminals 77a to the number of the first signal output terminals 77b may be configured to be 1:3.

Provided that the minimum interval of data wires, as well as, the distance between the second terminal 11a and the corresponding electrically connected first signal input terminal 77a in the first direction D1 are constant, the height of the fan-out area in the second direction D2 (it could be understood that now the first signal input terminal 77a is electrically connected to the data wire by replacing the data line DATA in the embodiment shown in FIG. 4) may be determined by the minimum interval between two adjacent first signal input terminals 77a.

The minimum interval between two adjacent first signal input terminals 77a may be smaller than three times the distance/gap p between the connection points of two adjacent data lines DATA and the corresponding data wires show in FIG. 4 (for example, the length of the line segment AC in FIG. 4). For example, the minimum interval between two adjacent first signal input terminals 77a may be smaller than two times or one time the distance/gap p between the connection points of two adjacent data lines DATA and the corresponding data wires show in FIG. 4.

When the first signal input terminals 77a are uniformly arranged at the same interval, the minimum interval between two adjacent first signal input terminals 77a may be three times the distance/gap p between the connection points of two adjacent data lines DATA and the corresponding data wires show in FIG. 4. According to Eq. (3)

$$h = w \times \frac{d}{\sqrt{p^2 - d^2}},$$

when the minimum interval of data wires, as well as, the distance between the second terminal 11a and the corresponding electrically connected first signal input terminal 77a in the first direction D1 are constant, because the minimum interval between two adjacent first signal input terminals 77a increases, the height of the second portion of the data wire in the second direction D2 may be effectively reduced.

For example, when the multiplexed circuit is provided in the first substrate, the height of the second portion of the data wire in the second direction D2 may be approximately reduced to one third of the height of the second portion of the data wire in the second direction D2 without the multiplexed circuit. Accordingly, the height of the fan-out area in the second direction D2 may be reduced, and the area occupied by the step area may be reduced, which may further narrow the frame/border of the display panel.

Figure 7B:
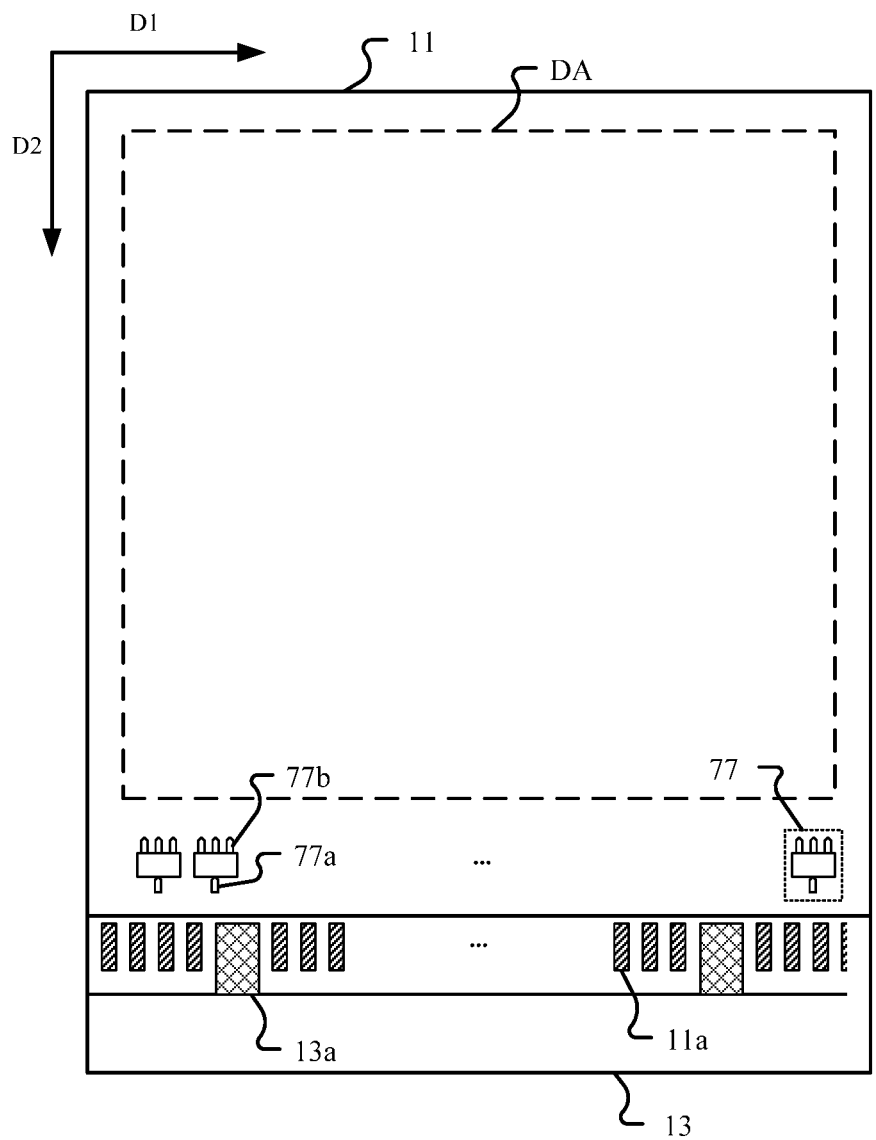
FIG. 7B illustrates a top view of another exemplary display panel consistent with disclosed embodiments.

FIG. 7B illustrates a top view of another exemplary display panel consistent with disclosed embodiments.

In one embodiment, as shown in FIG. 7B, in the first direction D1, the width of the COF 13 may be the same as the width of the first substrate 11. The ground pad 13a may be disposed on the COF 13. In the first direction D1, the COF 13 may be configured to have the same width as the first substrate 11. The first terminals 13b and the second terminal 11a may be arranged at a substantially large interval in the first direction D1, respectively.

In particular, the first terminals 13b may be one-to-one corresponding to the second terminals 11a, such that in the first direction D1, the distance between the second terminal 11a and the electrically connected first data input terminal 77a may be reduced. Thus, according to Eq. (3)

$$h = w \times \frac{d}{\sqrt{p^2 - d^2}},$$

when the minimum interval of data wires, as well as, the interval between two adjacent first signal input terminal 77a are constant, the height of the second portion of the data wire in the second direction D2 may be reduced. Accordingly, the height of the fan-out area in the second direction D2 may be reduced, which may narrow the frame/border of the display panel.

In one embodiment, in the first direction D1, the second terminals 11a may be uniformly arranged at the same interval.

In particular, when the minimum interval of data wires, as well as, the interval between two adjacent first signal input terminal 77a are constant, the height of the fan-out area in the second direction D2 may be determined by the maximum distance between the second terminal 11a and the electrically connected first signal input 77a in the first direction D1.

When the width of the COF 13 is the same as the width of the first substrate 11, and the second terminals 11a are uniformly arranged at the same interval, as shown in FIG. 7B, the distance between the second terminal 11a and the electrically connected first signal input 77a may be approximately zero in the first direction D1. For example, when the second terminals 11a are one-to-one corresponding to the first signal input terminals 77a, and each second terminal 11a is aligned with the corresponding first signal input terminal 77a, the distance between the second terminal 11a and the electrically connected first signal input 77a may be approximately zero in the first direction D1. Thus, according to Eq. (3)

$$h = w \times \frac{d}{\sqrt{p^2 - d^2}},$$

the height h of the second portion of the data wire may be approximately zero in the second direction D2, which may narrow the frame/border of the display panel.

Figure 8A:
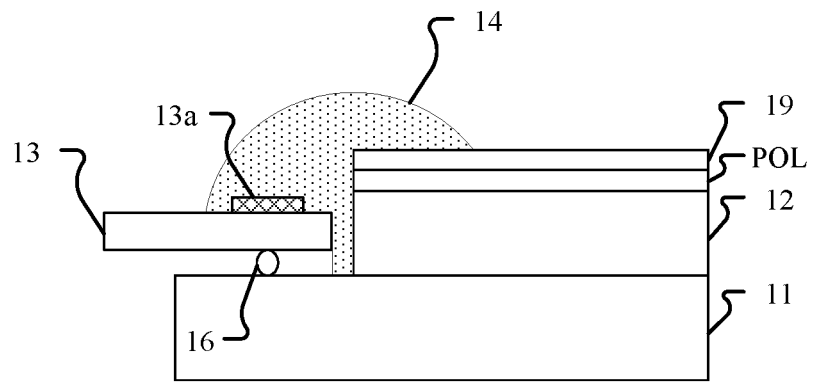
FIG. 8A illustrates a cross-sectional view of another exemplary display panel consistent with disclosed embodiments.

FIG. 8A illustrates a cross-sectional view of another exemplary display panel consistent with disclosed embodiments. The similarities between FIG. 1 and FIG. 8A are not repeated here, while certain difference may be explained.

As shown in FIG. 8A, similar to the display panel in FIG. 1, the display panel in FIG. 8A may comprise a conductive adhesive 14, a COF 13, a conductive layer 19, a first substrate 11 and a second substrate 12. At least one ground pad 13a may be disposed on the COF 13.

Different from the display panel in FIG. 1, the display panel in FIG. 8A may further comprise an upper polarizer POL, which transmits light having a polarization direction parallel to the polarization direction of the upper polarizer POL. The second substrate 12 may have a first surface facing the first substrate 11 and an opposite second surface far away from the first substrate 11. The upper polarizer POL may be disposed on the second surface of the second substrate 12.

Further, the upper polarizer POL may have a first surface facing the first substrate 11 and an opposite second surface far away from the first substrate 11. The conductive layer 19 may be disposed on the second surface of the upper polarizer POL.

In one embodiment, the conductive layer 19 may be multiplexed as the upper polarizer POL. A corresponding structure is shown in FIG. 8B.

Figure 8B:
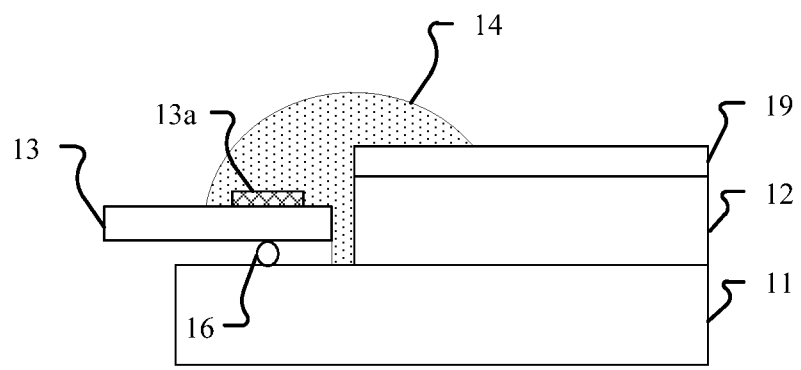
FIG. 8B illustrates a cross-sectional view of another exemplary display panel consistent with disclosed embodiments.

FIG. 8B illustrates a cross-sectional view of another exemplary display panel consistent with disclosed embodiments. The similarities between FIG. 8B and FIG. 8A are not repeated here, while certain difference may be explained.

As shown in FIG. 8B, the conductive layer 19 may include not only a conductive material for guiding static electricity to be released, but also a polarizing material that transmits light having a polarization direction parallel to the polarization direction of the polarizing material. Accordingly, the conductive layer 19 may also be referred as a conductive polarizer, i.e., the conductive layer 19 may have both a conductive function and a polarizing function. Thus, an individual conductive layer or an individual upper polarizer may not have to be provided, simplifying the manufacturing process of the display panel and reducing the thickness of the display panel.

Figure 8C:
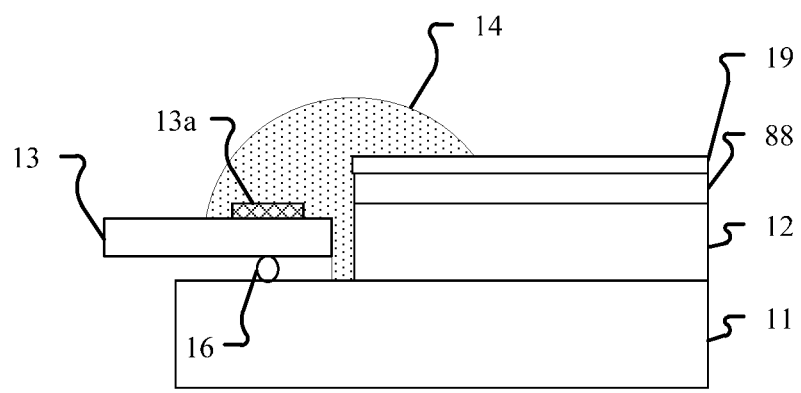
FIG. 8C illustrates a cross-sectional view of another exemplary display panel consistent with disclosed embodiments.

FIG. 8C illustrates a cross-sectional view of another exemplary display panel consistent with disclosed embodiments. The similarities between FIG. 8B and FIG. 8C are not repeated here, while certain difference may be explained.

As shown in FIG. 8C, the display panel may further include a protective cover 88 disposed on the second surface of the second substrate 12 (i.e., the surface far away from the first substrate 11). The protective cover 88 may have a first surface facing the first substrate 11 and an opposite second surface far away from the first substrate 11. The conductive layer 19 may be disposed on the second surface of the protective cover 88. The protective cover 88 may prevent the display panel from being damaged by an external force, thereby improving the reliability of the display panel.

In the disclosed embodiments, the conductive layer 19 may be disposed on a light-exiting side of the display panel. To suppress the influence of the conductive layer 19 on the light emission/transmission of the display panel, the conductive layer 19 may be configured to have a high light transmittance In one embodiment, the material of the conductive layer 19 may comprise at least one of indium tin oxide, indium zinc oxide, antimony tin oxide, and aluminum zinc oxide.

In particular, indium tin oxide, indium zinc oxide, antimony tin oxide, and zinc oxide aluminum are transparent conductive materials. When the conductive layer 19 includes at least one of indium tin oxide, indium zinc oxide, antimony tin oxide, and aluminum zinc oxide, the light transmittance of the conductive layer 19 may be substantially high, which may allow the display panel to have sufficient brightness.

The thickness of the conductive layer 19 may be determined according to various requirements, such as the conductivity and light transmittance of the conductive layer 19. In general, when the conductive layer increases, the conductivity of the conductive layer 19 may be improved, and the capability to conduct the static electricity may be also enhanced. However, the light transmittance of the conductive layer 19 may decrease as the thickness of the conductive layer 19 increases.

In the disclosed embodiments, to ensure both a desired light transmittance and a desired electrical conductivity of the conductive layer 19, the thickness of the conductive layer 19 may be configured to be approximately from 0.01 mm to 0.1 mm. In practical applications, the thickness of the conductive layer 19 may be determined according to various application scenarios, which is not limited by the present disclosure.

Figure 10:
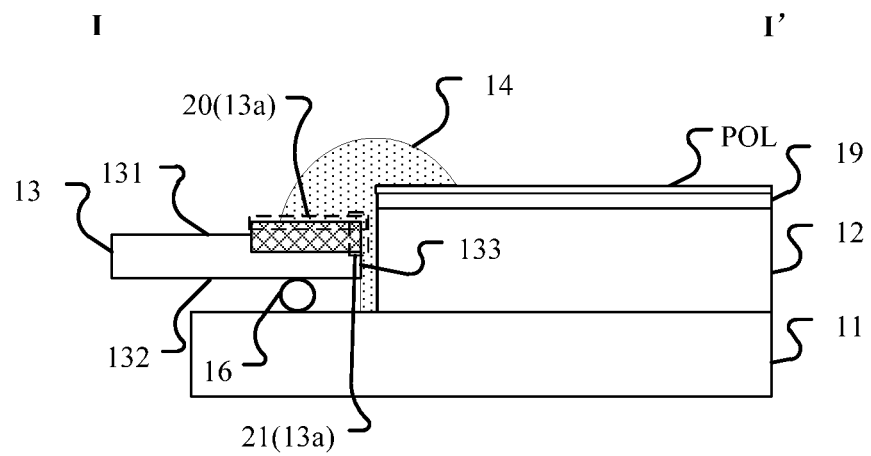
FIG. 10 illustrates a sectional view of another exemplary display panel along line I-I' in FIG. 2A consistent with disclosed embodiments.

FIG. 10 illustrates a sectional view of another exemplary display panel along line I-I' in FIG. 2A consistent with disclosed embodiments. In one embodiment, as shown in FIGS. 1, 2A and 10, a display panel may include a conductive adhesive 14, a COF 13, a conductive layer 19, a first substrate 11, and a second substrate 12 disposed opposite to the first substrate 11. The COF 13 may be bonded to a step area PA of the first substrate 11. The second substrate 12 may have a first surface facing the first substrate 11 and an opposite second surface away from the first substrate 11. The conductive layer 19 may be disposed on the second surface of the second substrate 12. The conductive adhesive 14 may be electrically connected to the conductive layer 19.

The COF 13 may include a first surface 132 facing the first substrate 11, an opposite second surface 131 away from the first substrate 11, and a first side 133 facing the second substrate 12. The first side 133 may intersect with the first surface 132 and the second surface 131, respectively. The second substrate 12 may further have a first side and an opposite second side. The first side 133 of the COF 13 may face the first side of the second substrate 12.

The COF 13 may include a ground pad 13a. The ground pad 13a may further include a first component 21 disposed on the first side 133 of the COF 13. The conductive adhesive 14 may be electrically connected to the first component 21. The conductive adhesive 14 may be configured or formed in any manner as described above in the present disclosure and not intended to limit the scope of the present disclosure herein.

As such, the conductive layer 19 may be electrically connected to the ground pad 13a. When the static electricity is generated on an upper surface of the second substrate 12 (e.g., the opposite second surface of the second substrate 12 away from the first substrate 11) during the use, for example, the static electricity may be transferred to the ground pad 13a through the conductive layer 19 and the conductive adhesive 14, and then released. Thus, the static electricity may be prevented from being accumulated on the upper surface of the second substrate 12, and prevented from being discharged inside of the display panel to cause a failure of the display panel.

Meanwhile, the ground pad 13a is disposed on the COF 13, thereby reducing the area occupied by the step area PA of the first substrate, increasing the proportion of the display area in the display panel, and further narrowing the frame of the display panel.

Figure 13:
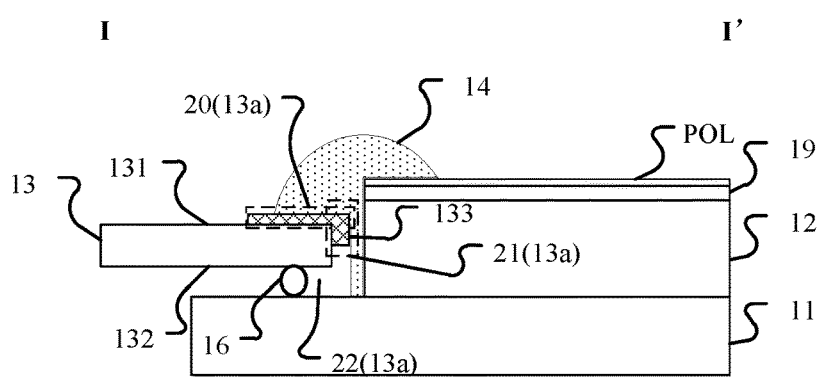
FIG. 13 illustrates a sectional view of another exemplary display panel along line I-I' in FIG. 2A consistent with disclosed embodiments.

FIG. 13 illustrates a sectional view of another exemplary display panel along line I-I' in FIG. 2A consistent with disclosed embodiments. In one embodiment, as shown in FIGS. 10 and 13, a ground pad 13a may further include a second component 20 disposed on the second surface 131 of the COF 13. A conductive adhesive 14 may be electrically connected to the second component 20.

For example, as shown in FIGS. 10 and 13, the ground pad 13a may include a first component 21 and a second component 20, both of which may be electrically connected to the conductive adhesive 14. The first component 21 and the second component 20 may be an integrated structure, or may be two sub-ground pads mutually connected via wires. When the first component 21 and the second component 20 constitute an integrated structure, as shown in FIG. 10, the first component 21 disposed on the first side 133 of the COF 13 may be exposed. Alternatively as shown in FIG. 13, the second component 20 may be disposed and extended on the second surface 131 of the COF 13, and bended at the first side 133 to adapt with the first component 21 disposed on the first side 133, thereby forming the ground pad 13a. The embodiments as described herein may increase the contact area between the conductive adhesive 14 and the ground pad 13a, thereby accelerating the release of the static electricity and improving the protection from static electricity.

Figure 11:
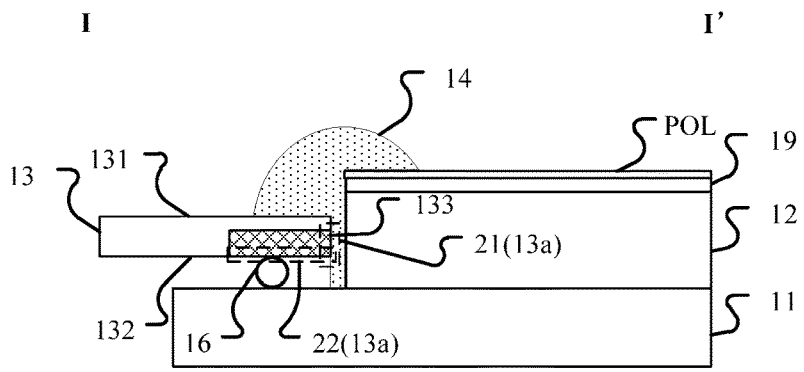
FIG. 11 illustrates a sectional view of another exemplary display panel along line I-I' in FIG. 2A consistent with disclosed embodiments.
Figure 14:
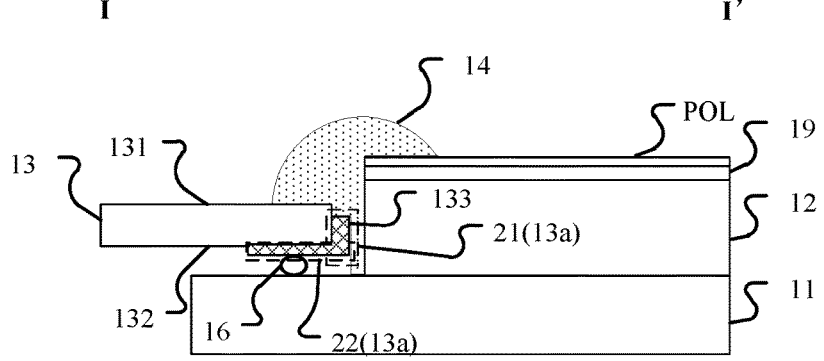
FIG. 14 illustrates a sectional view of another exemplary display panel along line I-I' in FIG. 2A consistent with disclosed embodiments.

FIGS. 11 and 14 illustrate sectional views of another two exemplary display panels along line I-I' in FIG. 2A consistent with disclosed embodiments. As shown in FIGS. 11 and 14 according to the embodiments, a ground pad 13a may further include a third component 22 disposed on the first surface 132 of the COF 13.

For example, as shown in FIGS. 11 and 14, the ground pad 13a may include a first component 21 and a third component 22. The two components may be an integrated structure, or may be two sub-ground pads mutually connected via wires. When the first component 21 and the second component 20 constitute an integrated structure as shown in FIG. 11, the first component 21 disposed on the first side 133 of the COF 13 may be exposed. Alternatively as shown in FIG. 14, the third component 22 may be disposed and extended on the first surface 132 of the COF 13, and bended at the first side 133 to adapt with the first component 21 disposed on the first side 133, thereby forming the ground pad 13a. In various embodiments, the third component 22 disposed on the first surface 132 of the COF 13 may provide ground signal to the first component 21, thereby achieving the protection from static electricity and significantly saving the cost for manufacturing COF 13.

Figure 12:
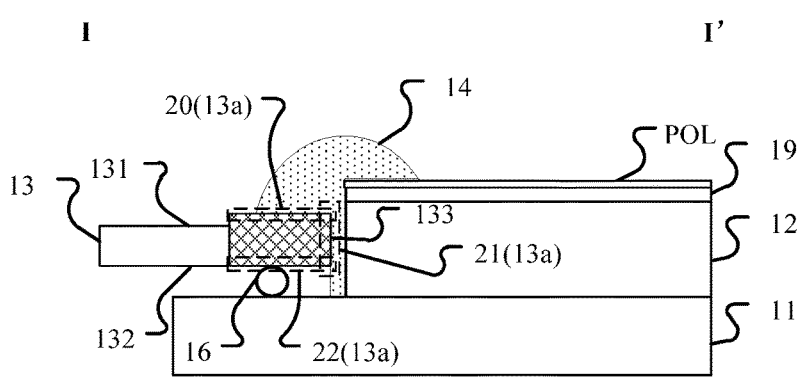
FIG. 12 illustrates a sectional view of another exemplary display panel along line I-I' in FIG. 2A consistent with disclosed embodiments.
Figure 15:
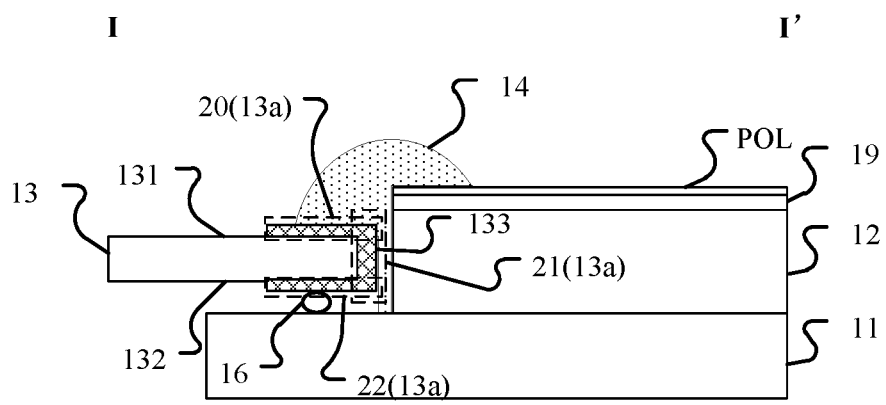
FIG. 15 illustrates a sectional view of another exemplary display panel along line I-I' in FIG. 2A consistent with disclosed embodiments.

FIGS. 12 and 15 illustrate sectional views of another two exemplary display panels along line I-I' in FIG. 2A consistent with disclosed embodiments.

In one embodiment, as shown in FIGS. 12 and 15, a ground pad 13a may include a first component 21, a second component 20 and a third component 22. The three components may be an integrated structure, or may be three sub-ground pads that are mutually connected end to end via wires. When such three components constitute an integrated structure, as shown in FIG. 12, the first component 21 disposed on the first side 133 of the COF 13 may be exposed, and the second component 20 disposed on the second surface 131 of the COF 13 may also be exposed. Alternatively as shown in FIG. 15, the third component 22 may be disposed and extended on the first surface 132 of the COF 13, bended on the first side 133 and the second surface 132 to adapt with the first component 21 and the second component 20, respectively, thereby forming the ground pad 13a. In various embodiments, the third component 22 disposed on the first surface 132 of the COF 13 may provide ground signal to the first component 21 and the second component 20, thereby achieving the protection from static electricity and significantly saving the cost for manufacturing COF 13.

Figure 16:
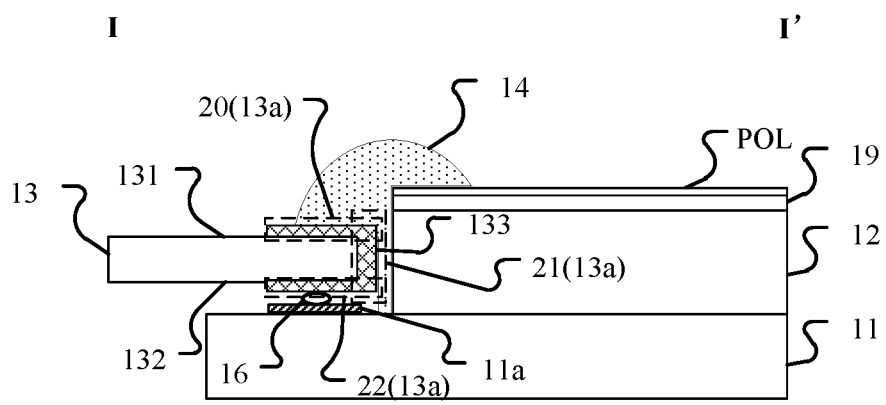
FIG. 16 illustrates a sectional view of another exemplary display panel along line I-I' in FIG. 2A consistent with disclosed embodiments.

FIG. 16 illustrates a sectional view of another exemplary display panel along line I-I' in FIG. 2A consistent with disclosed embodiments.

In one embodiment, as shown in FIG. 16, the first substrate 11 may have a first surface facing the COF and an opposite second surface, and at least one second terminal may be disposed on the first surface of the first substrate. The second terminal 11a may be electrically connected to a third component 22 of the ground pad 13a.

For example, as shown in FIG. 16, the second terminal 11a may be electrically connected to the third component 22 through an anisotropic conductive adhesive 16. The second terminal 11a may be a fan-out terminal of a display circuit or peripheral circuit disposed on the first substrate 11. In this case, the ground pad 13a may provide ground potential for the display circuit or peripheral circuit disposed on the first substrate 11, thereby exporting the static electricity in the display panel and achieving the protection from static electricity.

In another embodiment, as shown in FIGS. 11-16, a display panel may further include an upper polarizer (POL) disposed on the second surface of the second substrate 12 away from the first substrate 11. The upper polarizer may have a first surface facing the first substrate 11 and an opposite second surface. A conductive layer 19 may be disposed on the first surface of the upper polarizer. The upper polarizer may be conducive.

For example, as shown in FIGS. 11-16, the conductive layer 19 may be disposed between the second substrate 12 and the upper polarizer POL. The upper polarizer may be a low resistance conductor, providing a path for the electrical connection between the conductive layer 19 and the conductive adhesive 14.

Figure 9:
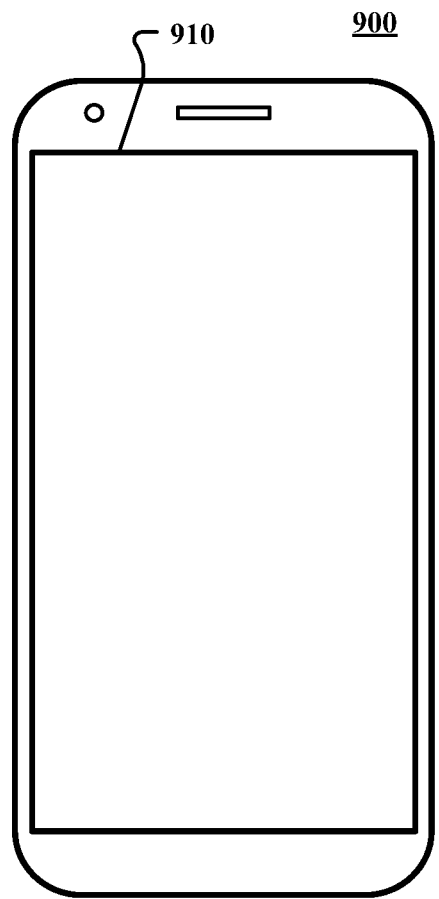
FIG. 9 illustrates an exemplary display device consistent with disclosed embodiments.

The present disclosure also discloses a display device. FIG. 9 illustrates an exemplary display device consistent with disclosed embodiments.

As shown in FIG. 9, the display device 900 may include a display panel 910, which may be any one of the display panels according to the disclosed embodiments. It should be noted that, in addition to the display panel 910, the display device may also include some other well-known structures, which will not be further described here.

Further, the display device 900 may be any appropriate device including the disclosed display panel. The display device 900 may include but not limited to a cellular mobile phone 900 shown in FIG. 9, a tablet, a computer display, a display device in smart wearable devices, and a display device in vehicles, etc. As long as the display device comprises any one of the disclosed display panels, the display device is considered to fall within the scope of the present disclosure.

In the disclosed display panel and the display device, through disposing the ground pad on the second surface of the COF (i.e., the surface of the COF far away from the first substrate), the generated static electricity may be released and, meanwhile, the area occupied by the step area of the first substrate may be reduced, which may narrow the frame/border of the display panel.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
a first substrate having a step area;
a second substrate disposed opposite to the first substrate, wherein the second substrate has a first surface facing the first substrate and an opposite second surface;
a Chip On Flex (COF) disposed on the step area of the first substrate and comprising at least one ground pad, wherein:
the COF has a first surface facing the first substrate, a second surface opposing the first surface, and a first side intersecting with the first surface and the second surface, respectively, and
the at least one ground pad includes a first component disposed on the first side of the COF;
a conductive layer disposed on the second surface of the second substrate; and
a conductive adhesive electrically connected to the conductive layer and at least the first component of the at least one ground pad.

2. The display panel according to claim 1, wherein:
the at least one ground pad further includes a second component disposed on the second surface of the COF; and
the conductive adhesive is electrically connected to the second component.

3. The display panel according to claim 2, wherein:
the at least ground pad further includes a third component disposed on the first surface of the COF.

4. The display panel according to claim 1, wherein:
the at least ground pad further includes a third component disposed on the first surface of the COF.

5. The display panel according to claim 4, wherein:
the first substrate has a first surface facing the COF and an opposite second surface, and at least one second terminal is disposed on the first surface of the first substrate; and
the at least one second terminal is electrically connected to the third component.

6. The display panel according to claim 1, wherein:
the conductive adhesive includes a conductive silver paste or a conductive tape.

7. The display panel according to claim 1, wherein:
a plurality of first terminals are disposed on the first surface of the COF;
the first substrate has a first surface facing the COF and an opposite second surface, and a plurality of second terminals are disposed on the first surface of the first substrate; and
the plurality of first terminals are one-to-one electrically connected to the plurality of second terminals.

8. The display panel according to claim 7, wherein:
the plurality of first terminals and the plurality of second terminals are arranged in a first direction, respectively, wherein the first substrate has a first side close to the COF and an opposite second side far away from the COF, and the first direction is an extending direction of the first side of the first substrate.

9. The display panel according to claim 8, wherein the first substrate further includes:
a plurality of multiplexing circuits disposed in a non-display area;
each of the plurality of multiplexing circuits includes at least one first signal input terminal;
the at least one first signal input terminal in each of the plurality of multiplexing circuits is electrically connected to a second terminal;
the at least one first signal input terminal in each of the plurality of multiplexing circuits is arranged in the first direction; and
the non-display area surrounds a display area of the display panel.

10. The display panel according to claim 7, wherein:
in a direction perpendicular to the first substrate, the at least one ground pad does not overlap with the plurality of first terminals.

11. The display panel according to claim 7, wherein:
in a direction perpendicular to the first substrate, a first terminal overlapped with the at least one ground pad is electrically connected to a ground signal or a dummy signal.

12. The display panel according to claim 1, further including:
an upper polarizer disposed on the second surface of the second substrate, the upper polarizer having a first surface facing the first substrate and an opposite second surface far away from the first substrate; and
the conductive layer is disposed on the second surface of the upper polarizer.

13. The display panel according to claim 1, further including:
a conductive upper polarizer disposed on the second surface of the second substrate, the upper polarizer having a first surface facing the first substrate and an opposite second surface; and
the conductive layer is disposed on the first surface of the upper polarizer.

14. The display panel according to claim 1, further including:
an upper polarizer disposed on the second surface of the second substrate; and
the conductive layer is multiplexed the upper polarizer.

15. The display panel according to claim 1, further including:
a protective cover disposed on the second surface of the second substrate, the protective cover having a first surface facing the first substrate and an opposite second surface far away from the first substrate; and
the conductive layer is disposed on the second surface of the protective cover.

16. The display panel according to claim 1, wherein:
the conductive layer comprises at least one of indium tin oxide, indium zinc oxide, antimony tin oxide, and aluminum zinc oxide.

17. A display device, comprising:
a display panel comprising:
a first substrate having a step area;
a second substrate disposed opposite to the first substrate, wherein the second substrate has a first surface facing the first substrate and an opposite second surface;
a Chip On Flex (COF) disposed on the step area of the first substrate and comprising at least one ground pad, wherein:
the COF has a first surface facing the first substrate and a second surface opposing the first surface, and a first side intersecting with the first surface and the second surface, respectively, and
the at least one ground pad includes a first component disposed on the first side of the COF;

a conductive layer disposed on the second surface of the second substrate; and a conductive adhesive electrically connected to the conductive layer and at least the first component of the at least one ground pad.

* * * * *